United States Patent
Zhang et al.

(10) Patent No.: US 11,973,479 B2
(45) Date of Patent: Apr. 30, 2024

(54) TWO-STAGE AUDIO GAIN CIRCUIT BASED ON ANALOG-TO-DIGITAL CONVERSION AND AUDIO TERMINAL

(71) Applicant: Radiawave Technologies Co., Ltd., Shenzhen (CN)

(72) Inventors: Liuan Zhang, Shenzhen (CN); Yulin Tan, Shenzhen (CN); Jon Sweat Duster, Beaverton, OR (US); Ning Zhang, Shenzhen (CN); Haigang Feng, Shenzhen (CN); Erkan Alpman, Portland, OR (US)

(73) Assignee: Radiawave Technologies Co., Ltd., Shenzhen (CN)

(*) Notice: Subject to any disclaimer, the term of this patent is extended or adjusted under 35 U.S.C. 154(b) by 284 days.

(21) Appl. No.: 17/508,686

(22) Filed: Oct. 22, 2021

(65) Prior Publication Data
US 2022/0045658 A1 Feb. 10, 2022

Related U.S. Application Data

(63) Continuation of application No. PCT/CN2020/085387, filed on Apr. 17, 2020.

(30) Foreign Application Priority Data

Apr. 29, 2019 (CN) .......................... 201910365778.5

(51) Int. Cl.
*H03M 1/00* (2006.01)
*G11B 20/10* (2006.01)
(Continued)

(52) U.S. Cl.
CPC ..... *H03G 3/3005* (2013.01); *G11B 20/10027* (2013.01); *H03G 3/001* (2013.01); *H03M 1/185* (2013.01); *G11B 20/10037* (2013.01)

(58) Field of Classification Search
CPC ................. H03G 3/3005; H03G 3/001; G11B 20/10027; G11B 20/10037; H03M 1/185
(Continued)

(56) References Cited

U.S. PATENT DOCUMENTS 9,813,814 B1* 11/2017 Satoskar .................. H04R 3/04
2015/0358187 A1 12/2015 Chou et al.
(Continued)

FOREIGN PATENT DOCUMENTS

CN 1700603 A 11/2005
CN 201600893 U 10/2010
(Continued)

OTHER PUBLICATIONS

Cao et al., A 500 mW ADC-Based CMOS AFE With Digital Calibration for 10 GB/s Serial Links Over KR-Backplane and Multimode Fiber, IEEE Journal of Solid-State Circuits, vol. 45, No. 6, pp. 1172-1185, dated Jun. 30, 2010.
(Continued)

*Primary Examiner* — Jean B Jeanglaude
(74) *Attorney, Agent, or Firm* — Westbridge IP LLC

(57) ABSTRACT

Disclosed are a two-stage audio gain circuit based on analog-to-digital conversion and an audio terminal. The two-stage audio gain circuit includes a PGA configured to receive an analog audio signal and perform programmable gain amplification processing on the received analog audio signal; an ADC configured to convert the analog audio signal after the programmable gain amplification processing into a digital audio signal and output the digital audio signal; a first AGC gain unit configured to perform a first AGC processing on the digital audio signal and output a first gain adjustment value to the PGA, for the PGA to perform gain adjustment on the received analog audio signal; and a second AGC gain unit configured to perform a second AGC
(Continued)

processing on the digital audio signal and output a second gain adjustment value to the PGA, for the PGA to perform gain adjustment on the received analog audio signal.

9 Claims, 5 Drawing Sheets

(51) Int. Cl.
  *H03G 3/00* (2006.01)
  *H03G 3/30* (2006.01)
  *H03M 1/18* (2006.01)
(58) Field of Classification Search
  USPC .......................................................... 341/139
  See application file for complete search history.

(56) References Cited

U.S. PATENT DOCUMENTS

2016/0072465 A1* 3/2016 Das ...................... H03G 3/3089
                                                             381/120
2017/0179899 A1* 6/2017 Olochwoszcz ....... G10L 19/167

FOREIGN PATENT DOCUMENTS

| CN | 102868369 A | 1/2013 |
| CN | 103490740 A | 1/2014 |
| CN | 104242847 A | 12/2014 |
| CN | 107809258 A | 3/2018 |
| CN | 110113019 A | 8/2019 |

OTHER PUBLICATIONS

First Office Action issued in counterpart Chinese Patent Application No. 201910365778.5, dated Mar. 31, 2021.
Hung et al., A High Dynamic Range Programmable Gain Amplifier for HomePlug AV Powerline Communication System, 2013 IEEE International Symposium on Circuits and Systems (ISCAS), pp. 2715-2718, dated Dec. 31, 2013.
International Search Report and Written Opinion issued in corresponding PCT Application No. PCT/CN2020/085387, dated Jul. 16, 2020.

* cited by examiner

TWO-STAGE AUDIO GAIN CIRCUIT BASED ON ANALOG-TO-DIGITAL CONVERSION AND AUDIO TERMINAL

CROSS-REFERENCE TO RELATED APPLICATIONS

This application is a continuation application of International Application No. PCT/CN2020/085387, filed on Apr. 17, 2020, which claims priority to Chinese Patent Application No. 201910365778.5, filed on Apr. 29, 2019, the entire disclosure of which is incorporated herein by reference.

TECHNICAL FIELD

The present disclosure relates to the technical field of signal processing, and in particular to a two-stage audio gain circuit based on analog-to-digital conversion and an audio terminal.

BACKGROUND

Audio rates mainly include 12 k/24 k/48 k/96 k/192 k, 8 k/16 k/32 k/64 k/128 k or 11.025 k/22.05 k/44.1 k/88.2 k/176.4 k and so on. The common practice is to oversample through an analog-to-digital converter (ADC), then through a cascaded integrator-comb (CIC) decimation filter, and then through the half-band filter to reduce to the desired audio rate. Sometimes it is necessary to perform rate conversion to obtain the desired audio rate.

In the actual process, when a person speaks with a microphone, whether the person speaks in a small or loud voice, is far away from the microphone, or close to the microphone, we all hope to hear every word of the speaker clearly. At this time, it needs automatic gain control (AGC) to automatically adjust the gain of the signal, so that the statistical amplitude of the signal can be stabilized in an interval or close to a certain value, or the signal can be stabilized in an interval or close to a certain value according to the statistical amplitude per unit time.

In some cases, we not only want to be able to distinguish the loudness of the sound and the distance, but also hope that the statistical amplitude of the signal is large and not saturated. In the related art, a certain segment of audio signal is processed mainly through analog, digital methods, or frame and non-frame methods. However, these processing methods cannot prevent the audio signal from being too large or too small at a moment, and the statistical amplitude of the signal within a period of time is too large or too small, resulting in low gain accuracy of the audio signal.

SUMMARY

The main purpose of the present disclosure is to provide a two-stage audio gain circuit based on analog-to-digital conversion and an audio terminal, aiming to improve the accuracy of audio gain control in the audio terminal.

In order to achieve the above objective, the present disclosure provides a two-stage audio gain circuit based on analog-to-digital conversion, including:

a programmable gain amplifier (PGA) configured to receive an analog audio signal and perform programmable gain amplification processing on the received analog audio signal;

an analog-to-digital converter configured to convert the analog audio signal after the programmable gain amplification processing into a digital audio signal and output the digital audio signal;

a first automatic gain control (AGC) gain unit configured to perform a first AGC processing on the digital audio signal and output a first gain adjustment value to the PGA, for the PGA to perform gain adjustment on the received analog audio signal according to the first gain adjustment value; and a second AGC gain unit configured to perform a second AGC processing on the digital audio signal and output a second gain adjustment value to the PGA, for the PGA to perform gain adjustment on the received analog audio signal according to the second gain adjustment value.

In at least one embodiment, the second AGC gain unit is further configured to convert the second gain adjustment value into a multiplier coefficient;

the two-stage audio gain circuit based on analog-to-digital conversion further includes:

a multiplier configured to multiply the digital audio signal with the multiplier coefficient converted by the second AGC gain unit to perform digital gain adjustment.

In at least one embodiment, both the first AGC gain unit and the second AGC gain unit include:

an envelope taking unit configured to perform absolute value processing on an audio value of the digital audio signal to take an absolution value of the audio value, and obtain an envelope curve of the digital audio signal;

a moving average unit configured to perform moving average processing on the envelope curve;

an amplitude statistics unit configured to perform statistics on an effective value of the envelope curve after the moving average processing, and output an effective statistical value; and a gain value output unit configured to obtain and output a gain adjustment value to be adjusted according to the effective statistical value.

In at least one embodiment, the gain value output unit includes a soft AGC unit, a table look-up AGC unit and a data selector;

the soft AGC unit is configured to determine the gain adjustment value to be adjusted according to a current effective statistical value and a preset target gain value;

the table look-up AGC unit is configured to look up a preset gain adjustment value mapping table according to the current effective statistical value to determine the gain adjustment value to be adjusted; and the data selector is configured to output the gain adjustment value determined by the soft AGC unit or output the gain adjustment value determined by the table look-up AGC unit.

In at least one embodiment, the moving average unit is configured to perform moving average processing on the envelope curve according to a preset calculation formula $[X(n)+X(n-1)+ \ldots +X(n-N+1)]/N$; X is an absolute value of the audio value of the digital audio signal, and N is any number from 1 to 128.

In at least one embodiment, the PGA includes a first PGA and a second PGA;

the first PGA is configured to perform a first gain adjustment on the received analog audio signal according to the first gain adjustment value; and the second PGA is configured to perform a second gain adjustment on the received analog audio signal according to the second gain adjustment value.

In at least one embodiment, the first gain adjustment is adjusted in a first preset range, and an adjustment accuracy of the first preset range is a first preset accuracy;

the second gain adjustment is adjusted in a second preset range, and an adjustment accuracy of the second preset range is a second preset accuracy; and the first preset accuracy is greater than the second preset accuracy.

In at least one embodiment, the two-stage audio gain circuit based on analog-to-digital conversion further includes a filter unit configured to perform filtering processing on the digital audio signal for which the PGA performs gain adjustment.

In at least one embodiment, the filter unit includes a cascaded integrator-comb (CIC) filter, a first half band filter (HBF) and a second HBF connected in sequence, an input end of the CIC filter is an input end of the filter unit, and an output end of the second HBF is an output end of the filter unit.

The present disclosure further provides an audio terminal, including the two-stage audio gain circuit based on analog-to-digital conversion as described above.

In technical solutions of the present disclosure, the two-stage audio gain circuit based on analog-to-digital conversion includes a programmable gain amplifier (PGA), an analog-to-digital converter, a first automatic gain control (AGC) gain unit, and a second AGC gain unit. The PGA is configured to receive an analog audio signal and perform programmable gain amplification processing on the received analog audio signal. The analog-to-digital converter is configured to convert the analog audio signal after the programmable gain amplification processing into a digital audio signal and output the digital audio signal. The first AGC gain unit and the second AGC gain unit are set after the analog-to-digital converter. After the analog-to-digital converter converts the analog audio signal into a digital audio signal for output, the first AGC gain unit performs a first AGC processing on the digital audio signal, and outputs the first gain adjustment value to the PGA. The PGA performs gain adjustment on the received analog audio signal according to the first gain adjustment value, and the audio data after gain adjustment by the first gain adjustment value is output through the analog-to-digital converter. After the analog-to-digital converter converts the analog audio signal into a digital audio signal for output, the second AGC gain unit performs a second AGC processing on the digital audio signal, and outputs the second gain adjustment value to the PGA. The PGA performs gain adjustment on the received analog audio signal according to the second gain adjustment value, and the audio data after gain adjustment by the second gain adjustment value is output through the analog-to-digital converter. The present disclosure solves the problem that the audio signal input in the audio terminal is too large or too small at a moment, and the statistical amplitude of the signal within a period of time (in frames or subframes) is too large or too small. The technical solution of the present disclosure improves the accuracy of audio gain control in audio device.

BRIEF DESCRIPTION OF THE DRAWINGS

In order to more clearly illustrate the embodiments of the present disclosure, drawings used in the embodiments will be briefly described below. Obviously, the drawings in the following description are only some embodiments of the present disclosure. It will be apparent to those skilled in the art that other figures can be obtained according to the structures shown in the drawings without creative work.

Figure 1:
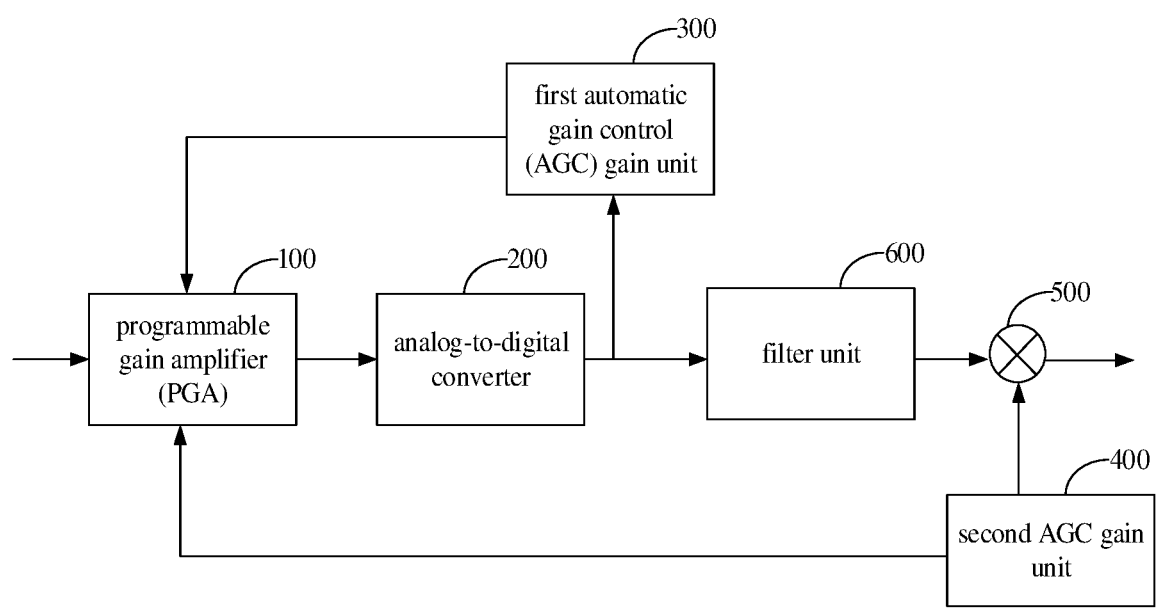
FIG. 1 is a schematic structural diagram of a two-stage audio gain circuit based on analog-to-digital conversion according to an embodiment of the present disclosure.

The realization of the objective, functional characteristics, and advantages of the present disclosure are further described with reference to the accompanying drawings.

DETAILED DESCRIPTION OF THE EMBODIMENTS

The technical solutions of the embodiments of the present disclosure will be described in more detail below with reference to the accompanying drawings. It is obvious that the embodiments to be described are only some rather than all of the embodiments of the present disclosure. All other embodiments obtained by persons skilled in the art based on the embodiments of the present disclosure without creative efforts shall fall within the scope of the present disclosure.

It should be noted that if there is a directional indication (such as up, down, left, right, front, rear . . . ) in the embodiments of the present disclosure, the directional indication is only used to explain the relative positional relationship, movement, etc. of the components in a certain posture (as shown in the drawings). If the specific posture changes, the directional indication will change accordingly.

It should be noted that, the descriptions associated with, e.g., "first" and "second," in the present disclosure are merely for descriptive purposes, and cannot be understood as indicating or suggesting relative importance or impliedly indicating the number of the indicated technical feature. Therefore, the feature associated with "first" or "second" can expressly or impliedly include at least one such feature. In addition, the technical solutions between the various embodiments can be combined with each other, but they must be based on the realization of those of ordinary skill in the art. When the combination of technical solutions is contradictory or cannot be achieved, it should be considered that such a combination of technical solutions does not exist, nor is it within the scope of the present disclosure.

The present disclosure provides a two-stage audio gain circuit based on analog-to-digital conversion, applied to an audio terminal, and the audio terminal can be a speaker, a headset, a microphone, or the like. In the actual process, when a person speaks with a microphone, whether the person speaks in a small or loud voice, is far away from the microphone or close to the microphone, we all hope to hear every word of the speaker clearly, and at this time it needs automatic gain control (AGC) to automatically adjust the gain of the signal, so that the statistical amplitude of the signal can be stabilized in an interval or close to a certain value, or the signal can be stabilized in an interval or close to a certain value according to the statistical amplitude per unit time.

In some cases, we not only want to be able to distinguish the loudness of the sound and the distance, but also hope that the statistical amplitude of the signal is large and not saturated. It is understandable that the statistical amplitude herein includes the maximum value of the signal amplitude or the root-mean-square (RMS) value of the signal, the maximum value of the signal envelope or the RMS value of the signal envelope, or the maximum value (or RMS value) of the signal (or signal envelope) after moving average. In the related art, a certain segment of audio signal is processed mainly through analog, digital methods, or frame and non-frame methods. However, these processing methods cannot prevent the audio signal from being too large or too small at a moment, and the statistical amplitude of the signal within a period of time is too large or too small.

In order to solve the above problem, in an embodiment of the present disclosure, as shown in FIG. 1, the two-stage audio gain circuit based on analog-to-digital conversion includes:

a programmable gain amplifier (PGA) 100, configured to receive an analog audio signal and perform programmable gain amplification processing on the received analog audio signal;

an analog-to-digital converter 200, configured to convert the analog audio signal after the programmable gain amplification processing into a digital audio signal and output the digital audio signal;

a first automatic gain control (AGC) gain unit 300, configured to perform a first AGC processing on the digital audio signal and output a first gain adjustment value to the PGA 100, for the PGA 100 to perform gain adjustment on the received analog audio signal according to the first gain adjustment value; and a second AGC gain unit 400, configured to perform a second AGC processing on the digital audio signal and output a second gain adjustment value to the PGA 100, for the PGA 100 to perform gain adjustment on the received analog audio signal according to the second gain adjustment value.

In the above embodiments, the increase or decrease of the statistical amplitude of the signal can be obtained by configuring the gain of the PGA. The programmable gain amplifier includes a fully balanced differential amplifier module, a decoder module and a resistance switch array module. The resistance ratio of the negative feedback resistor divider in the fully balanced differential amplifier module determines the maximum gain of the amplifier. The decoding result of the decoder module controls the attenuation of the resistance switch array module to attenuate the input signal, and finally realizes the programmable gain of the amplifier. The resistance switch array module is two symmetrical resistance attenuation networks with analog switches, and their input resistance is constant to ensure a constant load effect on the front stage. The magnification of the programmable gain amplifier can be adjusted by the program, such that the full-range signal of the analog-to-digital converter 200 is homogenized, thus greatly improving the measurement accuracy. The automatic range conversion in the programmable gain amplifier is to automatically adjust the multiples of the processed audio signal as required to meet the subsequent circuit requirements. In this embodiment, the structure of PGA 100 is simple, the input resistance is constant, which forms a constant load effect on the front stage, and there is no need to add a buffer circuit to isolate the amplifier and the front stage.

In this embodiment, the PGA 100 receives the analog audio signal, performs programmable amplification processing on the analog audio signal, and outputs the analog audio signal to the analog-to-digital converter 200. After the analog-to-digital converter 200 converts the analog audio signal after the programmable gain amplification processing into a digital audio signal, the first AGC gain unit 300 performs the first AGC processing on the converted digital audio signal to output the first gain adjustment value, and the second AGC gain unit performs the second AGC processing on the converted digital audio signal to output the second gain adjustment value. The PGA 100 performs gain adjustment on the received analog audio signal according to the first gain adjustment value and the second gain adjustment value, so as to realize the closed-loop gain adjustment of the audio signal, thereby improving the accuracy of the audio signal.

In the above embodiments, the analog-to-digital converter (referred to as A/D converter or ADC) 200 is a circuit that converts an analog signal into a digital signal. The function of A/D conversion is to convert an analog signal with continuous time and continuous amplitude into a digital signal with discrete time and discrete amplitude. Therefore, A/D conversion generally involves four processes: sampling, holding, quantization, and encoding. In actual circuits, some of these processes are combined. For example, sampling and holding, quantization and coding are often implemented simultaneously during the conversion process.

It should be noted that, the analog-to-digital converter 200 in the above embodiment converts the analog audio signal after the programmable gain amplification process into a digital audio signal and outputs the digital audio signal. Specifically, the analog-to-digital converter 200 oversamples the analog audio signal after the programmable gain amplification process, converts the analog audio signal into a digital audio signal and outputs the digital audio signal. It can be understood that oversampling refers to the process of sampling the signal at a frequency much higher than twice the bandwidth of the signal or its highest frequency.

In the above embodiments, AGC is automatic gain control, which refers to an automatic control method that makes the gain of the amplification circuit automatically adjust with the signal strength. The circuit that realizes this function is referred to as an AGC loop. The AGC loop is a closed loop electronic circuit, which is a negative feedback system, and can be divided into two parts: a gain controlled amplification circuit and a control voltage forming circuit. The gain controlled amplification circuit is located in the forward amplification path, and its gain changes with the control voltage. The basic components of the control voltage forming circuit are an AGC detector and a low-pass smoothing filter, and sometimes also include components such as a gate circuit and a DC amplifier.

In this embodiment, the PGA 100, the analog-to-digital converter 200 and the first AGC gain unit 300 form a closed-loop electronic circuit. The PGA 100, the analog-to-digital converter 200 and the second AGC gain unit 400 form a closed-loop electronic circuit. When the first AGC gain unit 300 and the second AGC gain unit 400 output the gain adjustment value, the gain adjustment of the analog audio signal received by the PGA 100 is realized.

In technical solutions of the present disclosure, the two-stage audio gain circuit based on analog-to-digital conversion includes a programmable gain amplifier (PGA) 100, an analog-to-digital converter 200, a first automatic gain control (AGC) gain unit 300, and a second AGC gain unit 400. The PGA 100 is configured to receive an analog audio signal, perform programmable gain amplification processing on the received analog audio signal and outputs the analog audio signal to the analog-to-digital converter 200. The analog-to-digital converter 200 is configured to convert the analog audio signal after the programmable gain amplification processing into a digital audio signal and output the digital audio signal. The first AGC gain unit 300 and the second AGC gain unit 400 are set after the analog-to-digital converter 200. After the analog-to-digital converter 200 converts the analog audio signal into a digital audio signal for output, the first AGC gain unit 300 performs a first AGC processing on the digital audio signal, and outputs the first gain adjustment value to the PGA 100. The PGA 100 performs gain adjustment on the received analog audio signal according to the first gain adjustment value, and the audio data after gain adjustment by the first gain adjustment value is output through the analog-to-digital converter. After the analog-to-digital converter 200 converts the analog audio signal into a digital audio signal for output, the second AGC gain unit 400 performs a second AGC processing on the digital audio signal, and outputs the second gain adjustment value to the PGA 100. The PGA 100 performs gain adjustment on the received analog audio signal according to the second gain adjustment value, and the audio data after gain adjustment by the second gain adjustment value is output through the analog-to-digital converter. The present disclosure solves the problem that the audio signal input in the audio terminal is too large or too small at a moment, and the statistical amplitude of the signal within a period of time (in frames or subframes) is too large or too small. The technical solution of the present disclosure improves the accuracy of audio gain control in audio device.

In an embodiment, as shown in FIG. 1, the second AGC gain unit 400 is further configured to convert the second gain adjustment value into a multiplier coefficient;

the two-stage audio gain circuit based on analog-to-digital conversion further includes:

a multiplier 500, configured to multiply the digital audio signal with the multiplier coefficient converted by the second AGC gain unit 400 to perform digital gain adjustment.

Figure 3:
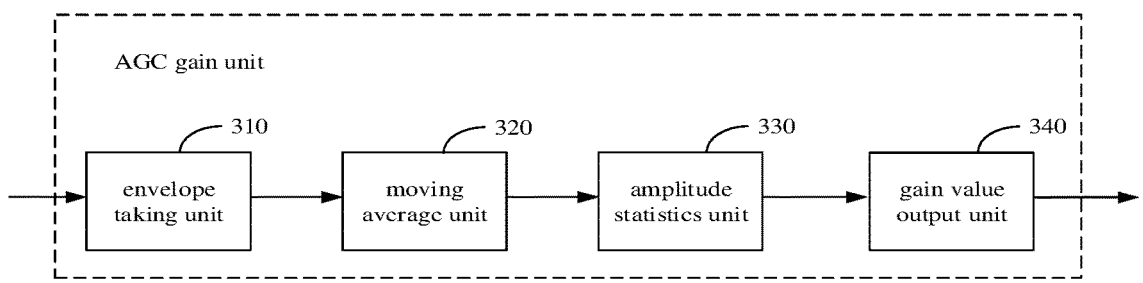
FIG. 3 is a schematic structural diagram of an AGC gain unit of the two-stage audio gain circuit based on analog-to-digital conversion in FIG. 1.

In this embodiment, the second gain adjustment value output by the second AGC gain unit 400 after the second AGC processing is a digital gain coefficient. The second gain adjustment value is converted into the multiplier coefficient required by the multiplier 500. That is, the digital gain coefficient obtained by the second AGC gain unit 400 is converted into a multiplier coefficient, and the converted multiplier coefficient is multiplied by the digital audio signal output by the analog-to-digital converter to realize digital gain adjustment. In an embodiment, as shown in FIG. 3, both the first AGC gain unit 300 and the second AGC gain unit 400 include:

an envelope taking unit 310, configured to perform absolute value processing on an audio value of the digital audio signal, and obtain an envelope curve of the digital audio signal;

a moving average unit 320, configured to perform moving average processing on the envelope curve;

an amplitude statistics unit 330, configured to perform statistics on an effective value of the envelope curve after the moving average processing, and output an effective statistical value; and a gain value output unit 340, configured to obtain and output a gain adjustment value to be adjusted according to the effective statistical value.

In this embodiment, after the analog-to-digital converter 200 converts the analog audio signal after the programmable gain amplification process into a digital audio signal and outputs the digital audio signal, the first AGC gain unit 300 processes the digital audio signal and the second AGC gain unit 400 processes the digital audio signal, that is, the digital audio signal is firstly processed by the envelope taking unit 310. Specially, taking an absolute |x| is performed on the audio value of the digital audio signal to obtain the envelope curve of the digital audio signal. The moving average processing is performed on the acquired envelope curve, after the moving average processing, the effective value of the envelope curve is obtained for statistics, and the effective statistical value is output. The gain value output unit 340 obtains the gain adjustment value to be adjusted according to the effective statistical value and outputs the gain adjustment value to the PGA 100. It can be understood that the first AGC gain unit 300 and the second AGC gain unit 400 adopt the same process to obtain the gain adjustment value to be adjusted and use two-stage audio gain adjustment to improve the accuracy of audio gain control in the audio terminal.

In the above embodiments, the absolute value |x| in the envelope taking unit 310 is to take the absolute value of each input digital audio signal.

The moving average unit 320 smoothes the data, and the preset specific formula is:

$$[X(n)+X(n-1)+ \ldots +X(n-N+1)]/N$$

X is the absolute value of the audio value of the digital audio signal after absolute value processing. N can be any number from 1 to 128. The larger the value of N, the more obvious the smoothing effect, and the more sluggish it is to signal changes; the smaller the value of N, the worse the smoothing effect, and the more sensitive it is to signal changes, which can be flexibly configured according to actual application scenarios. It should be noted that the moving average unit 320 herein can be connected with the a-mean filter, that is, after the moving average unit 320 performs the moving average processing according to the preset formula, the a-average filter may perform average filtering processing on the envelope curve of the moving average processing, and then output to the amplitude statistics unit.

The amplitude statistics unit 330 mainly performs amplitude statistics in units of non-frames and frames. In non-frame mode, each audio data point can be used as a statistical value of amplitude. In the frame mode, the maximum amplitude can be counted within a frame length, or the RMS value can be counted, or the minimum can be counted as a noise reference. If the maximum statistical amplitude is higher than the configured threshold, it is considered that there is voice audio or valid audio. If the maximum statistical amplitude is lower than the configured threshold, it is considered that there is no voice audio or valid audio, and the AGC gain unit may not act at this time. It is understandable that the time length of the frame can be set according to actual conditions, for example, it can be 1 ms, 5 ms, 10 ms, or the like, which is not limited herein.

Figure 4:
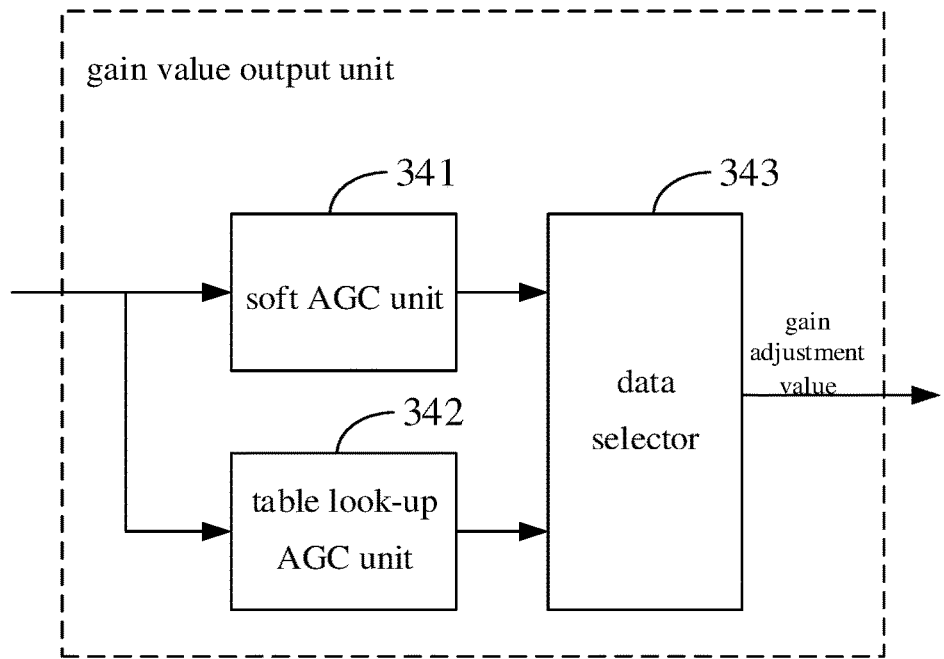
FIG. 4 is a schematic structural diagram of a gain value output unit in the AGC gain unit in FIG. 3.
Figure 5:
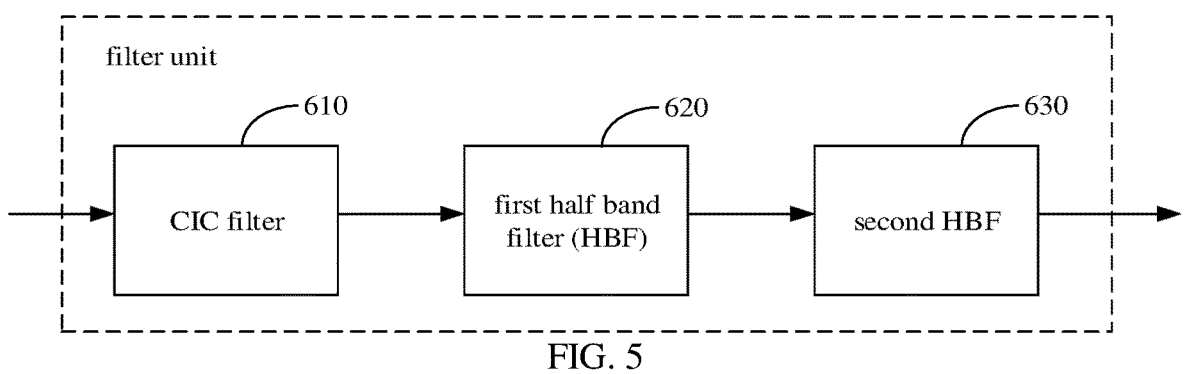
FIG. 5 is a schematic structural diagram of a filter unit of the two-stage audio gain circuit based on analog-to-digital conversion in FIG. 1.

In this embodiment, as shown in FIG. 4, the gain value output unit 340 includes a soft AGC unit 341, a table look-up AGC unit 342 and a data selector 343;

the soft AGC unit 341 is configured to determine the gain adjustment value to be adjusted according to a current effective statistical value and a preset target gain value;

the table look-up AGC unit 342 is configured to look up a preset gain adjustment value mapping table according to the current effective statistical value to determine the gain adjustment value to be adjusted; and the data selector 343 is configured to select to output the gain adjustment value determined by the soft AGC unit 341 or select to output the gain adjustment value determined by the table look-up AGC unit 342.

In the above embodiments, the soft AGC unit 341 is soft AGC, which adjusts the gain of the PGA 100 with a fixed step size, regardless of whether the current amplitude or the predicted amplitude is far or near the target value.

Figure 6:
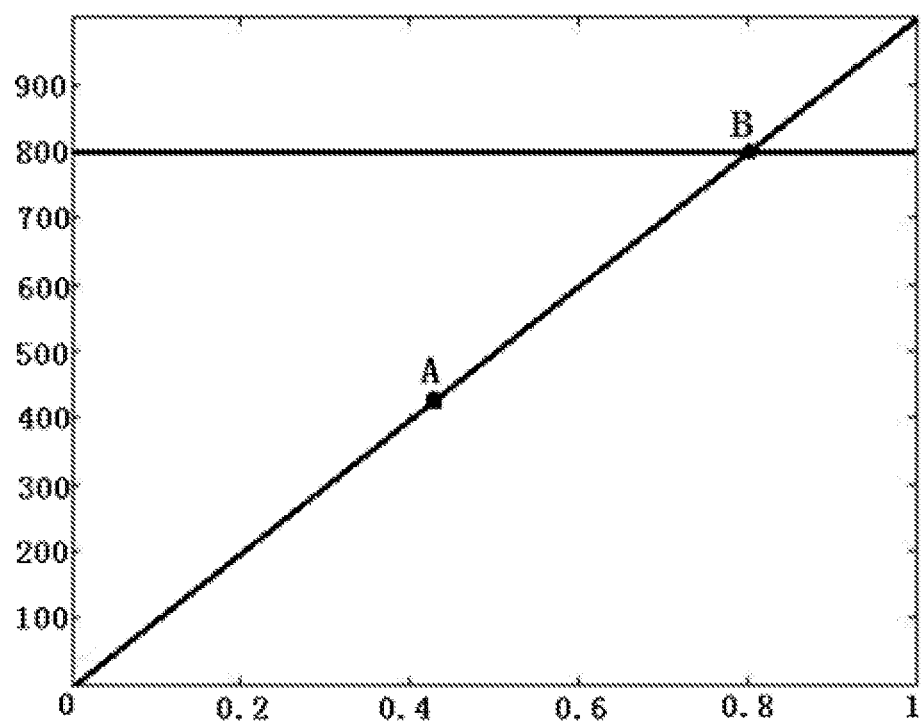
FIG. 6 is a schematic diagram of a predicted amplitude of the two-stage audio gain circuit based on analog-to-digital conversion according to an embodiment of the present disclosure.

It should be noted that, the predicted amplitude herein uses the concepts of velocity and acceleration. Velocity is compared to the first derivative (slope) at and near point A, and acceleration is compared to the second derivative at and near point A. As shown in FIG. 6, the current value is at point A, and the trend of the current amplitude can be predicted based on point A and the points before point A. According to the average of the first derivative and the average of the second derivative at and near point A and the number of fixed steps, the position of point B is calculated, to determine whether it is lower than the preset threshold, or greater than or equal to the preset threshold. The velocity value and acceleration value can be selected according to the following table, specifically:

| position | Data(n) | Data(n-1) | Data(n-2) | Data(n-3) |
|---|---|---|---|---|
| process | D0 | D1 | D2 | D3 |
| Velocity0 | (D4 − D0)/4 | | | |
| Velocity1 | (D2 − D0)/2 | | | |
| Velocity2 | (D1 − D0) | | | |

One of the velocity values can be selected in the above table. Velocity2 has the most sensitive response and is easily affected by noise; Velocity® has a slower response and better anti-noise performance. Understandably, Velocity refers to speed.

| position | Data(n) | Data(n-1) | Data(n-2) | Data(n-3) |
|---|---|---|---|---|
| process | X0 = D0 − D1 | X1 = D1 − D2 | X2 = D2 − D3 | X3 = D3 − D4 |
| accelaration0 | (X4 − X0)/4 | | | |
| Accelaration1 | (X2 − X0)/2 | | | |
| Accelaration2 | (X1 − X0) | | | |

One of the acceleration values can be selected according to this table. Accelaration2 has the most sensitive response and is easily affected by noise; acceleration0 has a slower response and better anti-noise performance. Understandably, acceleration refers to acceleration.

In the above embodiments, the table look-up AGC unit 342 is the table AGC, which adjusts the gain of the PGA 100 by changing the step size. According to the current amplitude or the predicted amplitude, the table entry is looked up to obtain the gain value of the PGA 100 that needs to be adjusted from the target value. If the current value or the predicted amplitude is far from the target value, the gain value of the adjusted PGA 100 is too large. If the current value or the predicted amplitude is closer to the target value, the gain value of the adjusted PGA 100 is too small.

It should be noted that, assuming that the current amplitude or predicted amplitude is X and the target value is T (target_value), the gain to be adjusted is G (gain_need_adjust)=20*log 10(T/X).

Assuming that the gain value of the current PGA 100 is G0 (gain0), the value of the PGA that needs to be set is Gs (gainset_to_pga)=G0+G.

Since the output of the analog-to-digital converter 200 is generally 12 bits, the table can be simplified to 256 depths. Simplifying the depth will bring performance loss, the specific calculation is as follows.

For the current amplitude or predicted amplitude X output by the analog-to-digital converter 200, the high 8 bits can be used. R refers to round, and the Round function returns a value, which is the result of the rounding operation according to the specified number of decimal places, then $G(8\ bit)=20*\log 10(T/\{R(X,8),3'b000\});$ $G(12\ bit)=20*\log 10(T/X).$ The error is: $G(8\ bit)-G(12\ bit)=20*\log 10(\{R(X,8), 3'b000\}/X).$ The input truncation error is: $\max\_error=20*\log 10(\{R(X,8),3'b000\}/X).$ When X is 0, max_error=−∞.

When X is 2047, max_error=20*log 10(2048/2047)= 0.004 db.

It should be noted that the db here is a ratio, a numerical value, and a pure counting method. In the above embodiments, when the 8-bit truncation is used to look up the table, the input error is relatively large when it is far from the target value, especially when x is small, and when it is close to the target value, the input error is relatively accurate. After the depth is determined, how many bits are required for the db found in each table entry also needs to be determined. Assuming that the precision of the PGA 100 is 1 db, if the adjustment of plus or minus 30 db is supported, 6 bits are required.

In the above embodiments, the first AGC gain unit 300 only works in the non-frame mode. Due to the delay of the PGA 100 and the analog-to-digital converter 200, it takes some time for the analog gain adjustment to take effect. Therefore, the gain adjustment in the digital domain needs to be delayed for a period of time to align the time point of the analog gain adjustment.

Figure 7:
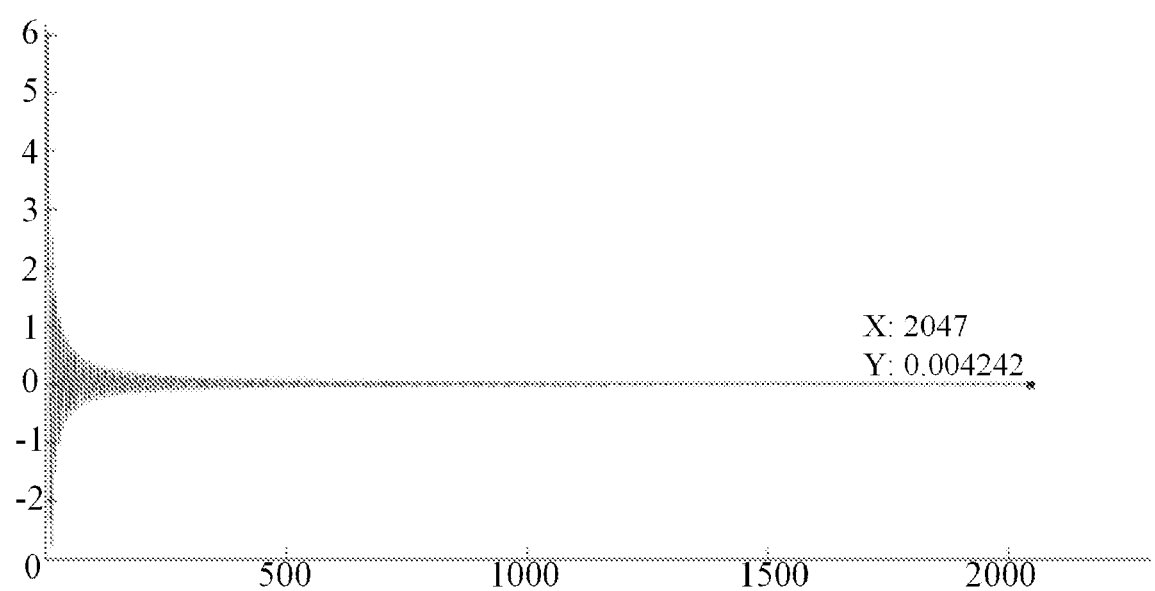
FIG. 7 is a schematic diagram of a digital gain compensation waveform of the second AGC gain unit of the two-stage audio gain circuit based on analog-to-digital conversion according to the present disclosure.

Compared with the table look-up AGC unit 342 of the first AGC gain unit 300, the table look-up AGC unit 342 in the second AGC gain unit 400 can also implement digital gain compensation, as shown in FIG. 7:

| item | Ana_db_incr | Digital_shift | Digital_less_6 db_incr |
|---|---|---|---|
| bitwdit | 6 bit | 5 bit | 8 bit |
| Note | Support −30 db to 30 db | Support shift left by 15 bits Or shift right by 15 bits | Support −5.9375 db to 5.9375 db |

Digital gain compensation can support a maximum left shift of 15 bits or a maximum right shift of 15 bits, that is, −90 db to +90 db, and support the range of −5.9375 db to 59375 db, and the minimum accuracy is 0.0625 db.

According to Di (Digital_less_6 db_incr) to query another 256-depth table, the corresponding coefficient Coff=10Di/20.

In the frame mode, that is, at the beginning of a new frame, after adjusting the analog gain in the analog domain first, the digital domain uses left shift or right shift to compensate for integer multiples, and then the multiplier 500 is used to compensate the remaining adjustment amount Coff less than 6 db in absolute value.

In the non-frame mode, due to the delay of the PGA 100 and the analog-to-digital converter 200, it takes some time for the analog gain adjustment to take effect. Therefore, the gain adjustment in the digital domain needs to be delayed for a period of time to align the time point of the analog gain adjustment.

Due to the loss in various calculation processes, the accuracy of the AGC gain unit is about 0.0625 db to 0.125 db. Through the above embodiments, the input look-up table depth is optimized, and the output item bit width is optimized, and the AGC accuracy of 0.5 db, 0.125 db, 0.0625 db or lower can be flexibly supported while saving resources.

It can be understood that during the process of multiplexed data transmission, the data selector 343 can select any one of the circuits as required, which is also called a multiplexer or a multiple-way switch. When the first AGC gain unit 300 obtains the first gain adjustment value, the data selector 343 selects the gain adjustment value obtained by the soft AGC unit 341 and outputs the gain adjustment value to the PGA 100. When the second AGC gain unit 400 obtains the second gain adjustment value, the data selector 343 selects the gain adjustment value obtained by the table look-up AGC unit 342 and outputs the gain adjustment value to the PGA 100, so that the PGA 100 performs gain adjustment on the received analog audio signal.

In the above embodiments, the first AGC gain unit 300 or the second AGC gain unit 400 can work independently or work together. When the first AGC gain unit 300 and the second AGC gain unit 400 work together, the first AGC gain unit 300 works in the non-frame mode and sets the target lower limit and the target upper limit, and the target lower limit and the target upper limit are different values. The second AGC gain unit 400 works in the frame mode table look-up AGC unit 342, and the analog and digital gains of the second AGC gain unit 400 are all turned on, and the target has only one value. The gain adjustment value of the PGA 100 generated by the second AGC gain unit 400 is an intra-frame long-term value, and the gain adjustment value of the PGA 100 generated by the first AGC gain unit 300 is an intra-frame short-term value. The amplitude prediction function of the second AGC gain unit 400 in the frame mode needs to be turned off, and the amplitude prediction function of the first AGC gain unit 300 can be turned on or off. The first AGC gain unit 300 performs short-term adjustment on the basis of the gain adjustment value of the PGA 100 of the second AGC gain unit 400, while ensuring that the analog-to-digital converter 200 is not saturated, the first AGC gain unit 300 needs to call back the gain adjustment value of the PGA 100 to the gain adjustment value of the PGA 100 of the second AGC gain unit 400. After the digital gain adjustment of the second AGC gain unit 400 is delayed for a certain time, it can be aligned with the analog gain adjustment of the second AGC gain unit 400 at a time point.

In an embodiment, the first AGC gain unit 300 works in the non-frame mode and sets the target lower limit and the target upper limit, and the target lower limit and the target upper limit are different values. The second AGC gain unit 400 works in the frame mode soft AGC unit 341 (without digital gain adjustment), and the target lower limit and the target upper limit may be different values or the same value. The gain adjustment value of the PGA 100 generated by the second AGC gain unit 400 is an intra-frame long-term value, and the gain adjustment value of the PGA 100 generated by the first AGC gain unit 300 is an intra-frame short-term value. The amplitude prediction function of the second AGC gain unit 400 in the frame mode needs to be turned off, and the amplitude prediction function of the first AGC gain unit 300 can be turned on or off. The first AGC gain unit 300 performs short-term adjustment on the basis of the gain adjustment value of the PGA 100 of the second AGC gain unit 400, while ensuring that the analog-to-digital conversion unit 200 is not saturated, the first AGC gain unit 300 needs to call back the gain adjustment value of the PGA 100 to the gain adjustment value of the PGA 100 of the second AGC gain unit 400.

Figure 2:
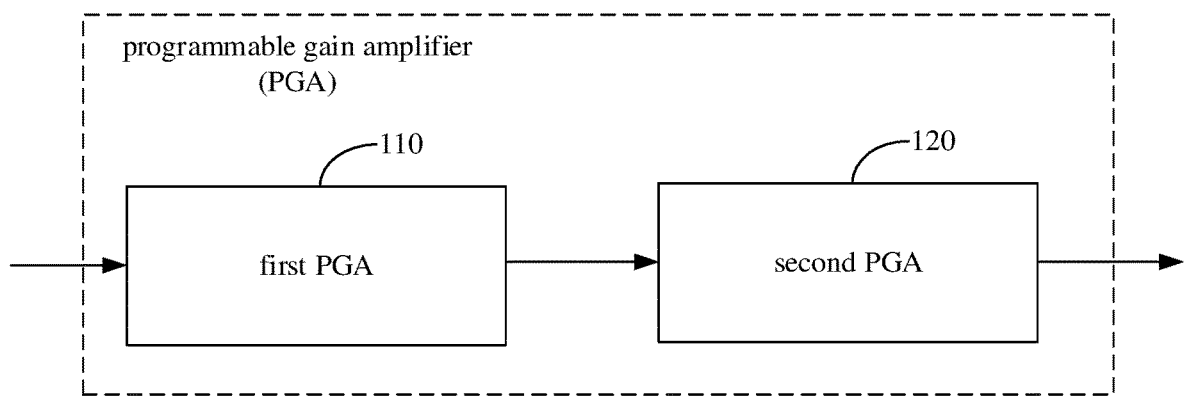
FIG. 2 is a schematic structural diagram of a PGA of the two-stage audio gain circuit based on analog-to-digital conversion in FIG. 1.

In an embodiment, as shown in FIG. 2, the PGA 100 includes a first PGA 110 and a second PGA 120;

the first PGA 110 is configured to perform a first gain adjustment on the received analog audio signal according to the first gain adjustment value of the first AGC gain unit 300; and the second PGA 120 is configured to perform a second gain adjustment on the received analog audio signal according to the second gain adjustment value of the second AGC gain unit 400.

Further, the first gain adjustment is adjusted in a first preset range, and an adjustment accuracy of the first preset range is a first preset accuracy;

the second gain adjustment is adjusted in a second preset range, and an adjustment accuracy of the second preset range is a second preset accuracy; and the first preset accuracy is greater than the second preset accuracy.

In this embodiment, the first PGA 110 performs gain adjustment on the received analog audio signal through the first gain adjustment value output by the first AGC gain unit 300. Since the frame period set by the first AGC gain unit 300 is long and the adjustment time is slow, the first PGA 110 is adjusted in the first preset range, and the adjustment accuracy is the first preset accuracy. The second PGA 120 performs gain adjustment on the received analog audio signal through the second gain adjustment value output by the second AGC gain unit 400. Since the frame period set by the second AGC gain unit 400 is short and the adjustment time is faster, the second PGA 120 is adjusted in the second preset range, and the adjustment accuracy is the second preset accuracy. The first preset accuracy is greater than the second preset accuracy. It is understandable that the first preset range can be −12 db to 36 db, the first preset accuracy is 6 db, the second preset range can be 0 to 6 db, and the second preset accuracy is 1 db. That is, the first gain adjustment is PGA coarse adjustment, and the second gain adjustment is PGA fine adjustment. The adjustment range and adjustment accuracy of the first gain adjustment and the second gain adjustment can also be other ranges and values, which are set according to actual conditions, and are not limited here. The frame period of the first AGC gain adjustment is greater than the frame period of the second AGC gain adjustment.

In the above embodiment, the number of PGA can be 1, 2, 4, or the like, which is not limited here.

In an embodiment, the two-stage audio gain circuit based on analog-to-digital conversion further includes a filter unit 600, configured to perform filtering processing on the digital audio signal for which the PGA 100 performs gain adjustment.

In this embodiment, the filter unit 600 includes a cascaded integrator-comb (CIC) filter 610, a first half band filter (HBF) 620 and a second HBF 630 connected in sequence, an input end of the CIC filter 610 is an input end of the filter unit 600, and an output end of the second HBF 620 is an output end of the filter unit 600.

In this embodiment, the CIC filter 610 is composed of one or more pairs of integrator-comb filters. In extracting CIC, the input signal goes through integration, down-sampling, and integration elements with the same number of combs in sequence. In the interpolated CIC, the input signal passes through the comb filter, up-sampling, and integration elements with the same number of combs in sequence.

Both the first HBF 620 and the second HBF 630 are half-band filters, which refer to a special low-pass FIR digital filter. Since the passband and stopband of this filter are symmetrical with respect to one-half of the Nyquist frequency, nearly half of the filter coefficients are exactly zero. That is, all the even coefficients are exactly zero, and the filter coefficient set can be written as {x, 0, x, 0, x, 0, . . . }.

The present disclosure further provides an audio terminal, which includes the above-mentioned two-stage audio gain circuit based on analog-to-digital conversion. The specific structure of the two-stage audio gain circuit based on analog-to-digital conversion can refer to the above-mentioned embodiments. Since this audio terminal adopts all the technical solutions of all the foregoing embodiments, it has at least all the beneficial effects brought about by the technical solutions of the foregoing embodiments, which will not be repeated here.

The above are only some embodiments of the present disclosure, and do not limit the scope of the present disclosure thereto. Under the inventive concept of the present disclosure, equivalent structural transformations made according to the description and drawings of the present disclosure, or direct/indirect application in other related technical fields are included in the scope of the present disclosure.

What is claimed is:

1. A two-stage audio gain circuit based on analog-to-digital conversion, comprising:
   a programmable gain amplifier (PGA) configured to receive an analog audio signal and perform programmable gain amplification processing on the received analog audio signal;
   an analog-to-digital converter configured to convert the analog audio signal after the programmable gain amplification processing into a digital audio signal and output the digital audio signal;
   a first automatic gain control (AGC) gain unit configured to perform a first AGC processing on the digital audio signal and output a first gain adjustment value to the PGA, for the PGA to perform gain adjustment on the received analog audio signal according to the first gain adjustment value; and
   a second AGC gain unit configured to perform a second AGC processing on the digital audio signal and output a second gain adjustment value to the PGA, for the PGA to perform gain adjustment on the received analog audio signal according to the second gain adjustment value,
   wherein both the first AGC gain unit and the second AGC gain unit comprise:
   an envelope taking unit, configured to perform absolute value processing on an audio value of the digital audio signal to take an absolution value of the audio value, and obtain an envelope curve of the digital audio signal;
   a moving average unit, configured to perform moving average processing on the envelope curve;
   an amplitude statistics unit, configured to perform statistics on an effective value of the envelope curve after the moving average processing, and output an effective statistical value; and
   a gain value output unit, configured to obtain and output a gain adjustment value to be adjusted according to the effective statistical value.

2. The two-stage audio gain circuit based on analog-to-digital conversion of claim 1, wherein the second AGC gain unit is further configured to convert the second gain adjustment value into a multiplier coefficient;
   the two-stage audio gain circuit based on analog-to-digital conversion further comprises:
   a multiplier, configured to multiply the digital audio signal with the multiplier coefficient converted by the second AGC gain unit to perform digital gain adjustment.

3. An audio terminal, comprising the two-stage audio gain circuit based on analog-to-digital conversion of claim 1.

4. The two-stage audio gain circuit based on analog-to-digital conversion of claim 1, wherein the gain value output unit comprises a soft AGC unit, a table look-up AGC unit and a data selector;
   the soft AGC unit is configured to determine the gain adjustment value to be adjusted according to a current effective statistical value and a preset target gain value;
   the table look-up AGC unit is configured to look up a preset gain adjustment value mapping table according to the current effective statistical value to determine the gain adjustment value to be adjusted; and
   the data selector is configured to output the gain adjustment value determined by the soft AGC unit or output the gain adjustment value determined by the table look-up AGC unit.

5. The two-stage audio gain circuit based on analog-to-digital conversion of claim 1, wherein the moving average unit is configured to perform moving average processing on the envelope curve according to a preset calculation formula $$[X(n)+X(n-1)+ \ldots +X(n-N+1)]/N;$$

X is an absolute value of the audio value of the digital audio signal, and N is any number from 1 to 128.

6. The two-stage audio gain circuit based on analog-to-digital conversion of claim 1, wherein the PGA comprises a first PGA and a second PGA;
   the first PGA is configured to perform a first gain adjustment on the received analog audio signal according to the first gain adjustment value; and
   the second PGA is configured to perform a second gain adjustment on the received analog audio signal according to the second gain adjustment value.

7. The two-stage audio gain circuit based on analog-to-digital conversion of claim 6, wherein the first gain adjustment is adjusted in a first preset range, and an adjustment accuracy of the first preset range is a first preset accuracy;
   the second gain adjustment is adjusted in a second preset range, and an adjustment accuracy of the second preset range is a second preset accuracy; and
   the first preset accuracy is greater than the second preset accuracy.

8. The two-stage audio gain circuit based on analog-to-digital conversion of claim 1, further comprising a filter unit configured to perform filtering processing on the digital audio signal for which the PGA performs gain adjustment.

9. The two-stage audio gain circuit based on analog-to-digital conversion of claim 8, wherein the filter unit comprises a cascaded integrator-comb (CIC) filter, a first half band filter (HBF) and a second HBF connected in sequence, an input end of the CIC filter is an input end of the filter unit, and an output end of the second HBF is an output end of the filter unit.

\* \* \* \* \*